(12) United States Patent
Nimmakayala et al.

(10) Patent No.: US 8,334,967 B2
(45) Date of Patent: *Dec. 18, 2012

(54) SUBSTRATE SUPPORT SYSTEM HAVING A PLURALITY OF CONTACT LANDS

(75) Inventors: Pawan Kumar Nimmakayala, Austin, TX (US); Sidlgata V. Sreenivasan, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 632 days.

This patent is subject to a terminal disclaimer.

(21) Appl. No.: 12/548,649

(22) Filed: Aug. 27, 2009

(65) Prior Publication Data
US 2010/0007868 A1     Jan. 14, 2010

Related U.S. Application Data

(63) Continuation-in-part of application No. 11/837,762, filed on Aug. 13, 2007, now abandoned.

(51) Int. Cl.
*G03B 27/58* (2006.01)
*G03B 27/62* (2006.01)
(52) U.S. Cl. ............................ 355/72; 355/75
(58) Field of Classification Search .................... 355/72, 355/75, 77; 269/266; 438/5
See application file for complete search history.

(56) References Cited

U.S. PATENT DOCUMENTS

| | | | |
|---|---|---|---|
| 4,750,141 | A | 6/1988 | Judell et al. |
| 5,028,361 | A | 7/1991 | Fujimoto |
| 5,534,073 | A | 7/1996 | Kinoshita et al. |
| 6,247,579 | B1 | 6/2001 | Fujiyama et al. |
| 6,726,195 | B1 | 4/2004 | Hertz et al. |
| 6,771,372 | B1 | 8/2004 | Traber |
| 6,809,802 | B1 | 10/2004 | Tsukamoto et al. |
| 7,150,622 | B2 | 12/2006 | Choi et al. |
| 7,179,079 | B2 | 2/2007 | Sreenivasan et al. |
| 7,245,358 | B2 | 7/2007 | Nimmakayala et al. |
| 7,259,833 | B2 | 8/2007 | Nimmakayala et al. |
| 7,307,697 | B2 | 12/2007 | Ganapathisubramanian et al. |
| 7,504,268 | B2 | 3/2009 | Ganapathisubramanian et al. |
| 2004/0036850 | A1 | 2/2004 | Tsukamoto et al. |
| 2006/0172031 | A1 | 8/2006 | Babbs et al. |
| 2006/0172549 | A1 | 8/2006 | Choi et al. |
| 2006/0172553 | A1 | 8/2006 | Choi et al. |
| 2007/0132153 | A1 | 6/2007 | Aiyer et al. |
| 2007/0170617 | A1 | 7/2007 | Choi et al. |
| 2007/0190200 | A1 | 8/2007 | Cherala et al. |
| 2007/0228589 | A1 | 10/2007 | Choi et al. |
| 2007/0231422 | A1 | 10/2007 | Cherala et al. |
| 2007/0287081 | A1 | 12/2007 | Cherala et al. |

*Primary Examiner* — Peter B Kim
(74) *Attorney, Agent, or Firm* — Cameron A. King

(57) ABSTRACT

The present invention includes a substrate support system having a chuck body. The chuck body includes a body surface with a pin extending therefrom having a contact surface lying in a plane. The pin may be movably coupled to the chuck body to move with respect to the plane. The pin may also include a cross-member having multiple contact lands.

20 Claims, 13 Drawing Sheets

SUBSTRATE SUPPORT SYSTEM HAVING A PLURALITY OF CONTACT LANDS

CROSS-REFERENCE TO RELATED APPLICATIONS

The present application is a Continuation-in-Part of U.S. patent application Ser. No. 11/837,762 filed Aug. 13, 2007, which is a Continuation-in-Part of U.S. patent application Ser. No. 11/136,886 filed May 25, 2005. U.S. patent application Ser. No. 11/136,886 claims priority to U.S. Provisional Patent Application No. 60/575,442 filed May 28, 2004, and is a Divisional of U.S. Pat. No. 7,245,358 (originally U.S. application Ser. No. 11/136,885) filed May 25, 2005. These applications are incorporated herein by reference.

BACKGROUND OF THE INVENTION

The field of invention relates generally to support for substrates. More particularly, the present invention is directed to a chuck suited for use in imprint lithography.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like. Many of the micro-fabrication techniques involve various processes, including deposition, such as chemical vapor deposition, physical vapor deposition, atomic layer deposition and the like, as well as wet and/or dry etching techniques to pattern substrates.

In addition to the standard micro-fabrication techniques, there exists a relatively new and efficient patterning technique referred to as imprint lithography. An exemplary imprint lithography is described in detail in numerous publications, such as U.S. Pat. No. 6,873,087 entitled HIGH PRECISION ORIENTATION ALIGNMENT AND GAP CONTROL STAGES FOR IMPRINT LITHOGRAPHY PROCESSES; U.S. Pat. No. 6,842,226, entitled IMPRINT LITHOGRAPHY TEMPLATE COMPRISING ALIGNMENT MARKS; U.S. Pat. No. 6,696,220 entitled TEMPLATE FOR ROOM TEMPERATURE, LOW PRESSURE MICRO-AND NANO-IMPRINT LITHOGRAPHY; and U.S. Pat. No. 6,719,915 entitled STEP AND FLASH IMPRINT LITHOGRAPHY, all of which are assigned to the assignee of the present invention. The fundamental imprint lithography technique as shown in each of the aforementioned published patent applications includes formatting a relief pattern in a polymerizable layer and transferring the relief pattern into an underlying substrate to form a relief image in the substrate. To that end, a template is employed spaced-apart from the substrate with a formable liquid present between the template and the substrate. The liquid is solidified forming a solidified layer that has a pattern recorded therein that is conforming to a shape of the surface of the template in contact with the liquid. The substrate and the solidified layer are then subjected to processes to transfer into the substrate a relief image that corresponds to the pattern in the solidified layer.

As a result of the aforementioned micro-fabrication techniques, the demand to ensure the flatness/planarity of substrates being processed/patterned has increased, because of the decreasing size of the features being formed. There are a number of factors affecting substrate planarity, many of which can be corrected by conventional substrate chucks. However, the presence of backside particles, particles that contact a surface of a substrate opposite to the surface being patterned, are problematic. For example, particles may become lodged between the substrate and the chuck, referred to as backside particles, which may cause out-of-plane distortion of the substrate resulting in distortions in the pattern generated on the substrate. Out-of-plane distortions may be characterized as possessing two parameters: 1) distortion height; and 2) gap radius. The distortion height is defined as the maximum out-of-plane deviation produced in the substrate by the backside particle. Gap radius is defined as a measure of the length of a region of the substrate spaced-apart from the chuck, measured between the particle and a point of the substrate closest to the particle at which the substrate contacts the chuck. It can be realized that the area of a substrate that undergoes distortion due to the presence of particulate contaminants is much greater than the size of the particulates.

Prior art attempts to overcome particulate contaminants include pin type and groove type chucks. These chucking systems attempt to avoid the drawbacks associated with backside particles by minimizing the contact area between the substrate and the chuck. However, these chucking systems only reduce the probability of particles being lodged between the chuck and the substrate, but do not avoid or attenuate the non-planarity should a particle get lodged between a chuck and a substrate.

There is a need, therefore, to provide improved support systems for substrates.

DETAILED DESCRIPTION OF THE INVENTION

Figure 1:
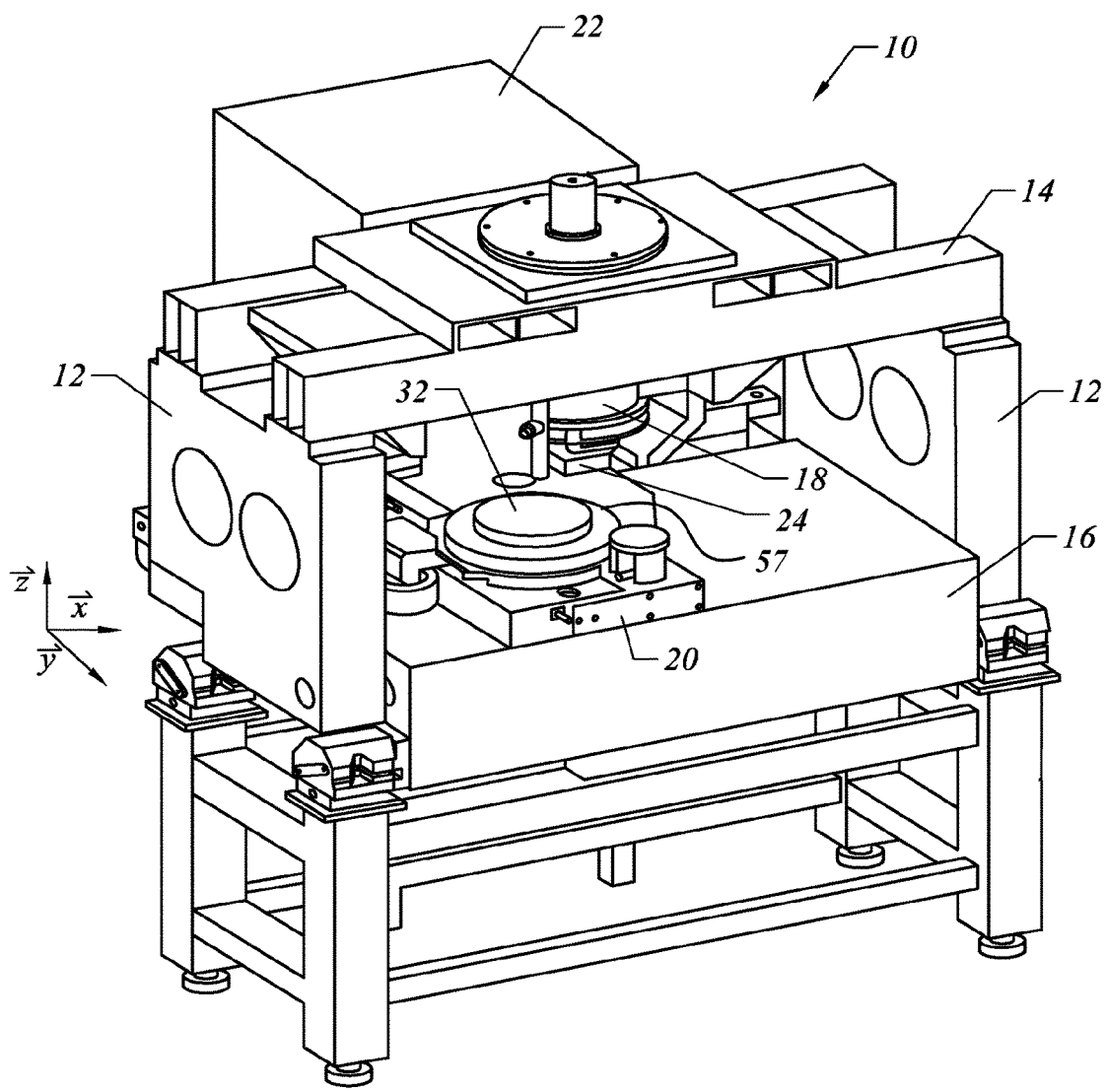
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X- and Y-axes and may provide movement along the Z-axis as well. A source 22 of energy is coupled to system 10 to generate and impinge actinic energy upon motion stage 20. As shown, source 22 is coupled to bridge 14.

Figure 2:
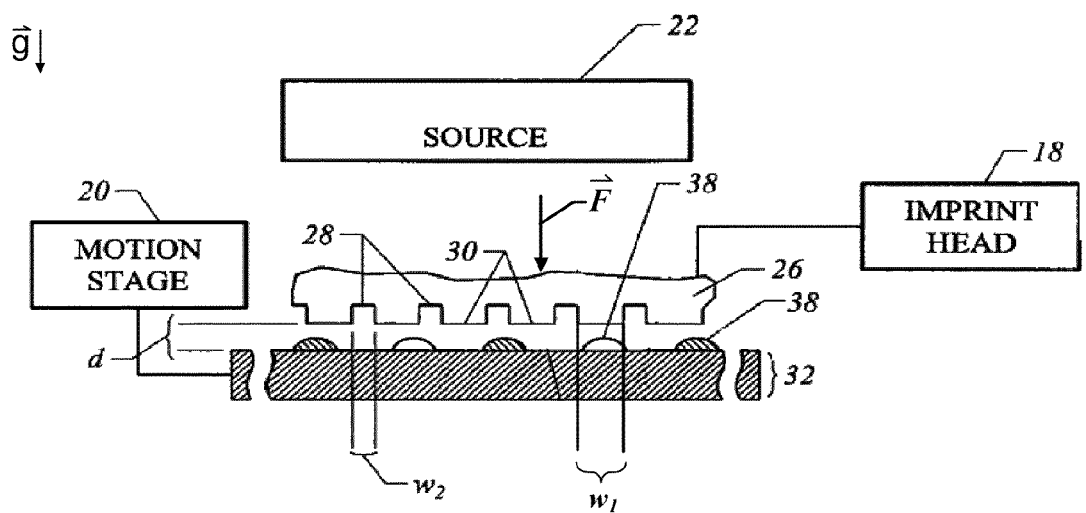
FIG. 2 is a simplified elevation view of a lithographic system, shown in FIG. 1, employed to create a patterned imprinting layer in accordance with the present invention.

Referring to both FIGS. 1 and 2, connected to imprint head 18 is a template 24 having a patterned mold 26 thereon that may be patterned or substantially smooth, if not planar. An exemplary template 24 is shown in U.S. Pat. No. 6,696,220, which is incorporated by reference herein. In the present example, mold 26 is patterned so as to include a plurality of features defined by a plurality of spaced-apart recesses 28 and projections 30. Projections 30 have a width $W_1$, and recesses 28 have a width $W_2$, both of which are measured in a direction that extends transversely to the Z-axis. The plurality of features defines an original pattern that forms the basis of a pattern to be transferred into a substrate 32 positioned on motion stage 20. To that end, imprint head 18 is adapted to move along the Z-axis and to vary a distance "d" between patterned mold 26 and substrate 32. Alternatively, or in conjunction with imprint head 18, motion stage 20 may move template 24 along the Z-axis. In this manner, the features on patterned mold 26 may be imprinted into a flowable region of substrate 32, discussed more fully below. Source 22 is located so that patterned mold 26 is positioned between source 22 and substrate 32. As a result, patterned mold 26 is fabricated from material that allows it to be substantially transparent to the energy produced by source 22.

Referring to FIG. 2, substrate 32 is patterned with a formable material that may be selectively solidified. To that end, the polymerizable material, shown as a plurality of spaced-apart discrete droplets 38, are disposed between mold 26 and substrate 32. Although the polymerizable material is shown as a plurality of droplets 38, the polymerizable material may be deposited employing any known technique, including spin coating techniques or wicking techniques. An exemplary wicking technique is discussed in U.S. Pat. No. 6,719,915, which is incorporated by reference herein. The polymerizable material may be selectively polymerized and cross-linked to record on substrate 32 an inverse of the original pattern therein, defining a recorded pattern, shown as an imprinting layer 34, in FIG. 3. Thereafter, suitable etch processes may be employed to transfer a desired pattern into substrate 32. In this regard, the term substrate is employed in a broad sense as including a bare semiconductor wafer, with or without a native oxide layer present thereon or with pre-existing layers, such as a primer layer formed from a material sold under a tradename DUV30J-6 available from Brewer Science, Inc. of Rolla, Mo.

Figure 3:
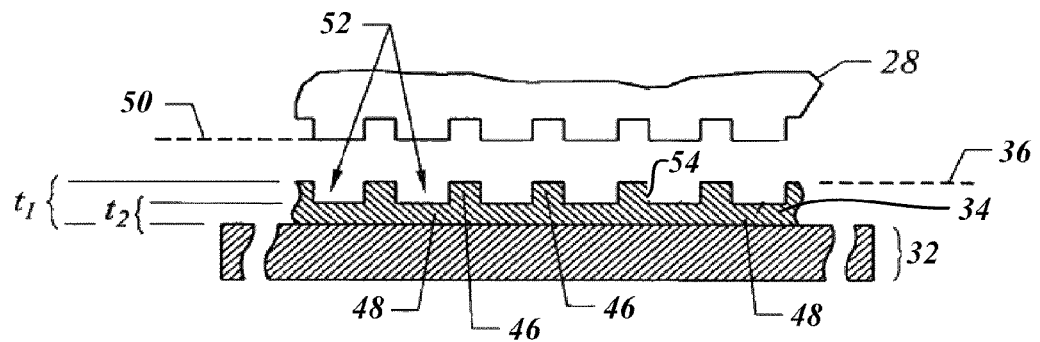
FIG. 3 is a simplified cross-sectional view of a mold and substrate, shown in FIG. 2, after solidification of an imprinting layer on the substrate.

Referring to FIGS. 2 and 3, the pattern recorded in imprinting layer 34 is produced, in part, by mechanical contact of droplets 38 with both substrate 32 and patterned mold 26. To that end, the distance "d" is reduced to allow droplets 38 to come into mechanical contact with substrate 32, spreading droplets 38 so as to form imprinting layer 34 with a contiguous formation of the imprinting material over surface 36 of substrate 32. In one embodiment, distance "d" is reduced to allow sub-portions 46 of imprinting layer 34 to ingress into and to fill recesses 28.

In the present embodiment, sub-portions 48 of imprinting layer 34 in superimposition with projections 30 remain after the desired, usually minimum distance "d", has been reached, leaving sub-portions 46 with a thickness $t_1$ and sub-portions 48 with a thickness $t_2$. Thickness $t_2$ is referred to as a residual thickness. Thicknesses "$t_1$" and "$t_2$" may be any thickness desired, dependent upon the application. The total volume contained in droplets 38 may be such so as to minimize, or to avoid, a quantity of material 40 from extending beyond the region of surface 36 in superimposition with patterned mold 26, while obtaining desired thicknesses $t_1$ and $t_2$.

Referring to FIGS. 2 and 3, after a desired distance "d" has been reached, source 22 produces actinic energy that polymerizes and cross-links the polymerizable material, forming layer 34 with cross-linked polymerized material. Specifically, layer 34 is solidified having a side 36 with a shape conforming to a shape of a surface 50 of patterned mold 26. As a result, imprinting layer 34 is formed having recessions 52 and protrusions 54. After formation of imprinting layer 34, distance "d" is increased so that patterned mold 26 and imprinting layer 34 are spaced-apart. This process may be repeated several times to pattern different regions (not shown) of substrate 32, referred to as a step and repeat process.

Figure 4:
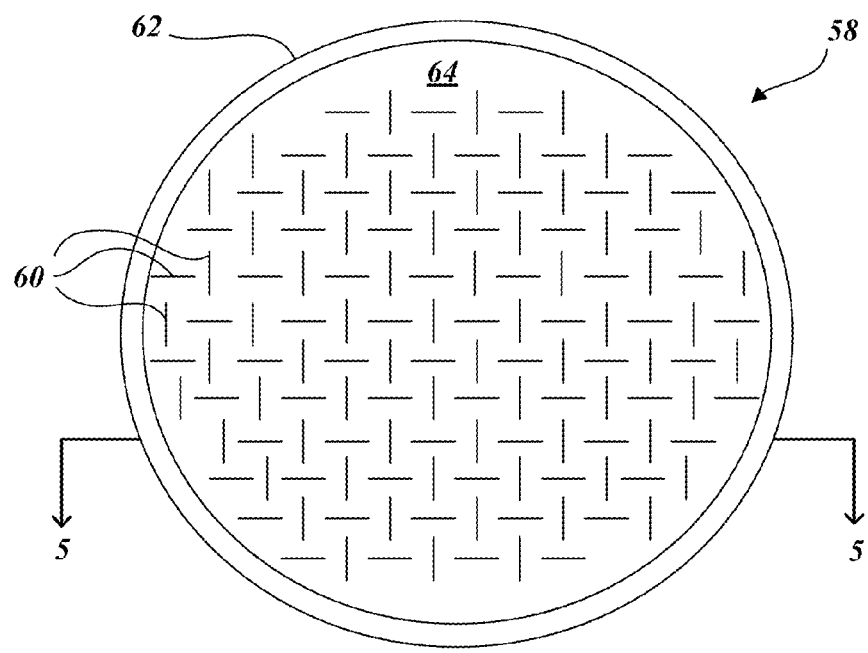
FIG. 4 is a top-down view of a chuck body employed in the chucking system, shown in FIG. 1, in accordance with one embodiment of the present invention.
Figure 5:
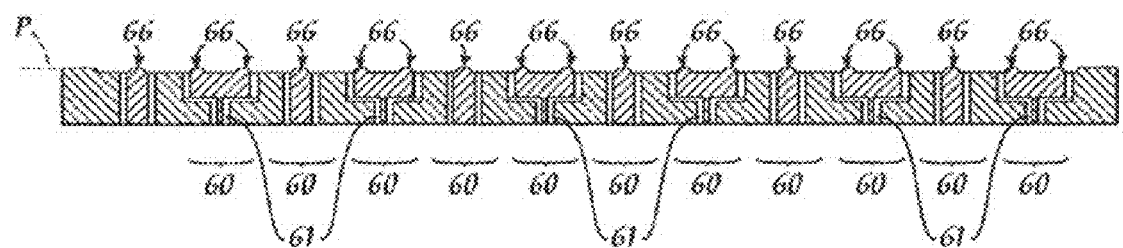
FIG. 5A is a cross-sectional view of one embodiment of a chuck body, shown in FIG. 4, taken along lines 5-5.
FIG. 5B is a perspective view of another embodiment of a chuck body.

Referring to FIGS. 1, 4 and 5, motion stage 20 includes a chucking system 57 upon which to support substrate 32, which includes a body 58 having a plurality of pin cells 60 surrounded by a rim 62. Specifically, body 58 includes a surface 64 surrounded by rim 62. Pin cells 60 include a pin 61 that extends from surface 64. Pin 61 includes a pair of spaced-apart contact surfaces 66 lying in a plane P. In a further embodiment, pin 61 may comprise multiple spaced-apart contact surfaces 66. For example, FIG. 5B illustrates pin 61 having three contact surfaces 66 (as shown in FIG. 5B). An apex surface 68 of rim 62 lies in plane P. Upon resting atop of rim 62, substrate 32 defines a chamber (not shown) between surface 64 and substrate 32, with pins 61 being disposed within the chamber (not shown). A pump (not shown) may be placed in fluid communication with the chamber (not shown) to evacuate the same, holding a periphery of substrate 32 firmly against rim 62 forming a seal. The remaining portion of substrate 32 surrounded by the seal is supported by pins 61.

Figure 6:
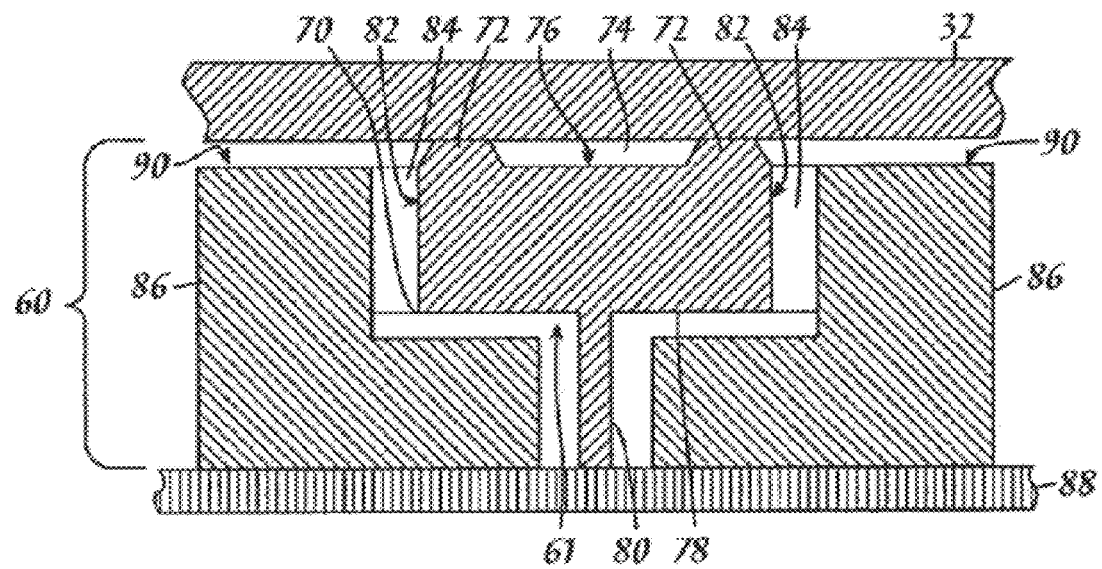
FIG. 6 is a detailed cross-sectional view of one of the pin cells 60 shown in FIG. 5, in a neutral state.
Figure 18:
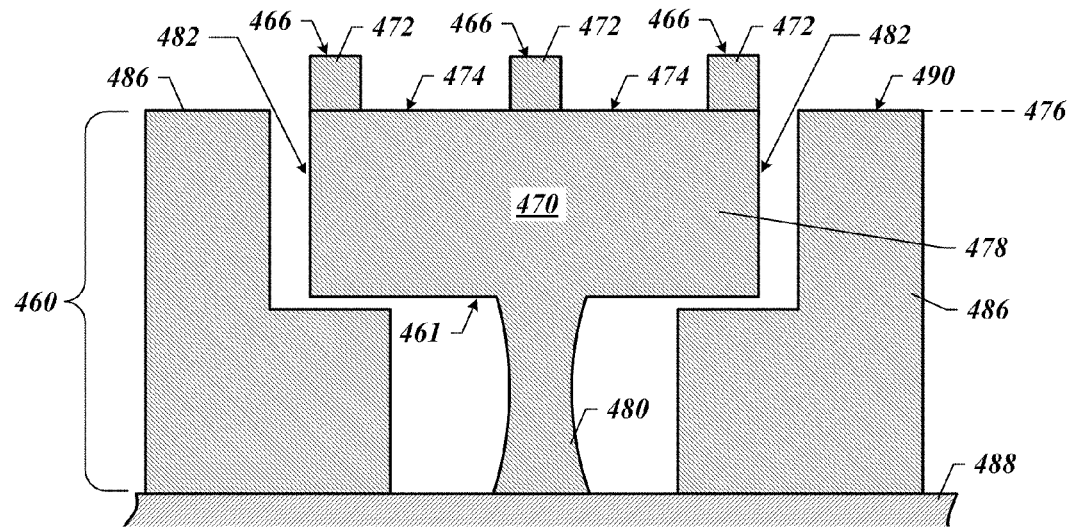
FIGS. 18-20 illustrate alternate embodiments of pin cells having multiple contact lands.
Figure 19:
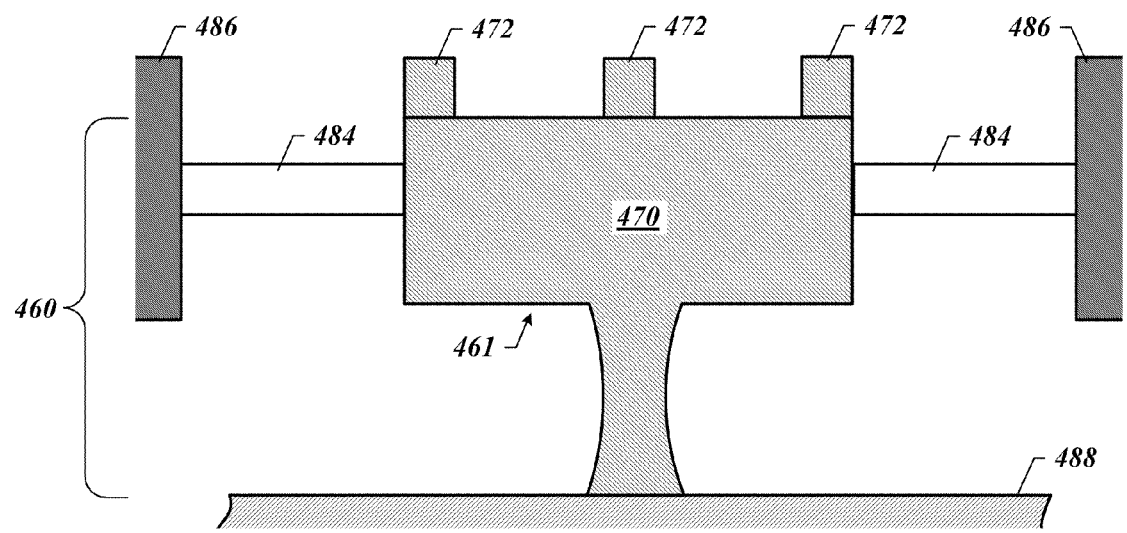
Figure 20A:
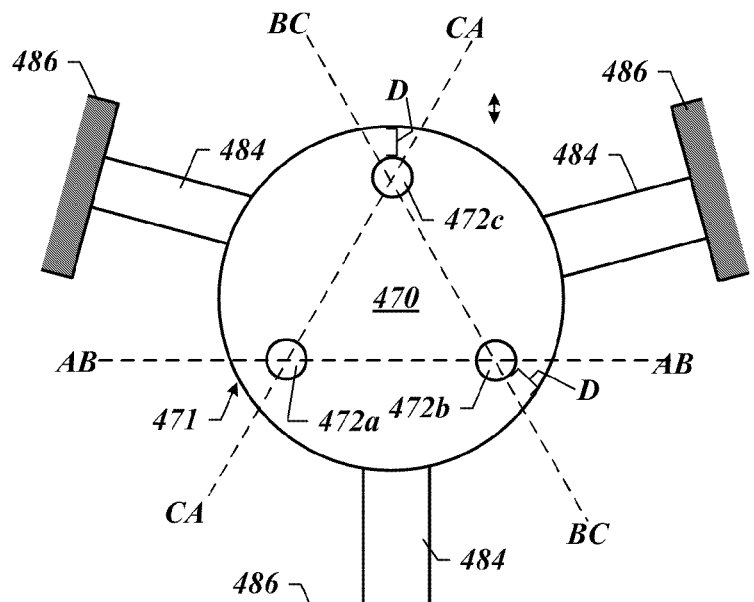
Figure 20B:
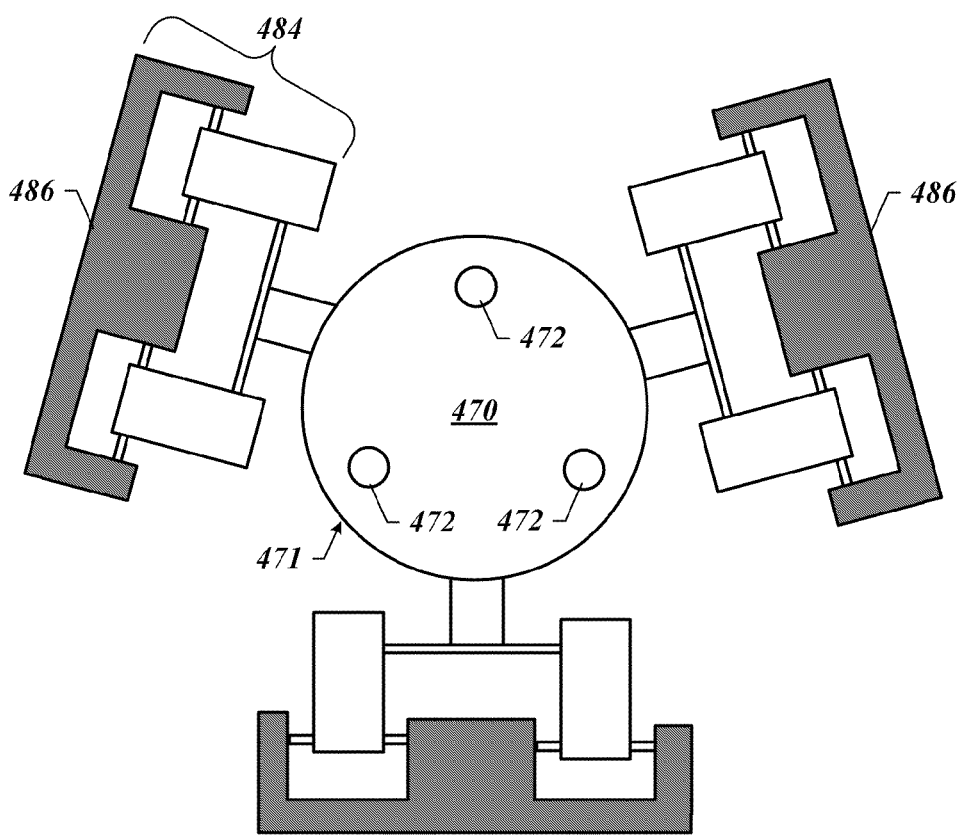

Referring to FIGS. 4 and 6, one or more of pin cells 60 are designed to minimize contact area with substrate 32. As a result, one or more of pins 61 have a T-shaped cross-section that includes a cross-member 70 having a pair of spaced-apart contact lands 72 extending therefrom and terminating in contact surface 66, defining a recess 74 therebetween. In a further embodiment, cross-member 70 may have multiple contact lands 72 extending therefrom and terminating in multiple contact surfaces 66 (shown in FIGS. 18-20). For example, FIGS. 18-20 illustrate the use of three contact lands 472; however, it should be noted that additional contact lands 72 may be used.

Recess 74 includes a nadir surface 76. A base portion 78 of cross-member 70, disposed opposite to nadir surface 76, is supported by a flexure stem 80. A pair of opposed sides 82 extends from base portion 78, terminating in contact surface 66. Extending from each of side surfaces 82, away from recess 74 is a side flexure 84. Specifically, each of side flexures 84 extends between a side wall 86 and one of side surfaces 82. Each side wall 86 extends from a support region 88, terminating in a surface 90. Surface 90 is spaced-apart from substrate 32 and in the present example lies in a common plane with nadir surface 76. Foundation region 88 extends between opposed side walls 86. Flexure stem 80 extends between foundation region 88 and base portion 78.

Figure 7:
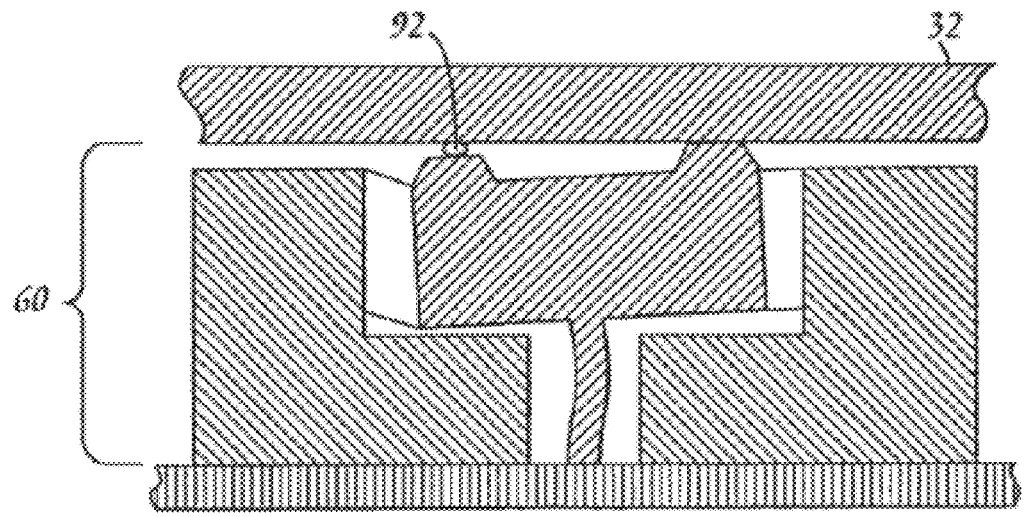
FIG. 7 is a detailed cross-sectional view of one of the pin cells 60 shown in FIG. 6, in a loaded state.

Pin cells 60 are configured so that contact lands 72 are equally loaded with force to which the same is subjected by substrate 32 resting on one of pins 61. In this manner, the load to which a given pin cell 60 is subjected is transferred to ground, i.e., foundation region 88. As a result each of pin cells 60 operates much like an ordinary pin-type chuck when supporting a "uniform normal load". However, unlike typical pin-type chucking mechanisms, in the presence of a non-uniform load, e.g., in the presence of a particulate contaminant 92 disposed between substrate 32 and one or more of contact lands 72, one or more of pins 61 becomes compliant. Specifically, flexure stem 80 and side flexures 84 flex, allowing pins 61 to be compliant. This minimizes, if not abrogates, non-planarity in substrate 32 due to the presence of particulate contaminant 92. In a further embodiment, in the example of cross-member 70 have multiple contact lands 72 terminating in multiple contact surfaces 66 (e.g., three or more spaced-apart contact lands 72 extending therefrom), mentioned above, pins 61 may further be compliant to one dimensional defects such as scratches. To that end, it is desired that the height of each of contact lands 72, measured between nadir surface 76 and contact surface 66, has a magnitude no less than the maximum dimension of anticipated particulate contaminants. As a result, in the presence of particulate contaminant 92, shown more clearly in FIG. 7, being disposed between contact surface 66 and substrate 32, cross-member 70 moves so as to avoid generation of non-planarity in substrate 32 due to particulate contaminant.

This is accomplished, in part, by establishing the relative bending stiffness of the various elements of each of pin cells 60 to obtain a desired movement of pin 61. For example, the bending stiffness of flexure stem 80 is less than the bending stiffness of either cross-member 70 or side flexures 84. The bending stiffness of cross-member 70 is substantially greater than side flexures 84. As a result, cross-member 70 is considered a rigid body. By establishing the relative bending stiffness among the components as mentioned above, rotation of cross-member 70 occurs about a remote axis, i.e., an axis spaced-apart from cross-member 70. As shown, various axes 93, 94, 95, 96, 97, 98, 99, 100, 101, 102, 103, 104, 105, 106 and 107 may function as the remote axis and, for a given pin 61, the axis among axes 93, 94, 95, 96, 97, 98, 99, 100, 101, 102, 103, 104, 105, 106 and 107 is dependent upon the size of particulate contaminant 92 and current configuration, i.e., designed bending stiffness ratio of flexure stem 80 to side flexures 84.

Figure 8:
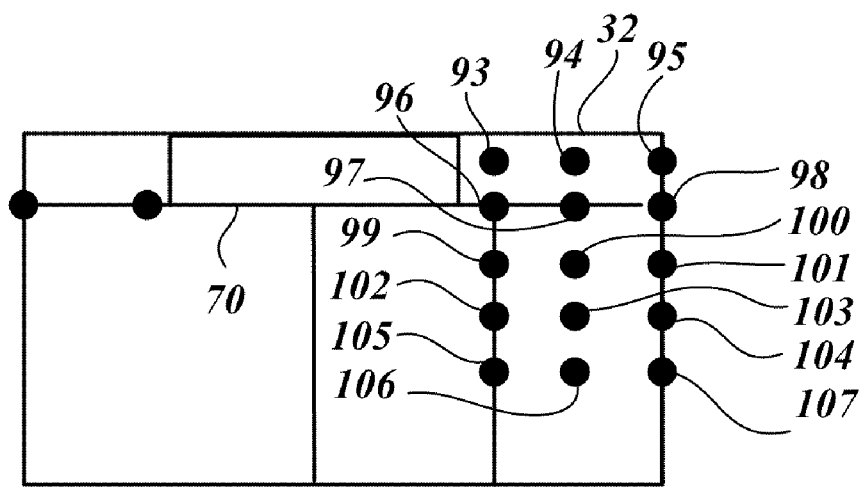
FIG. 8 is a schematic view of the pin cell shown in FIG. 6.
Figure 9:
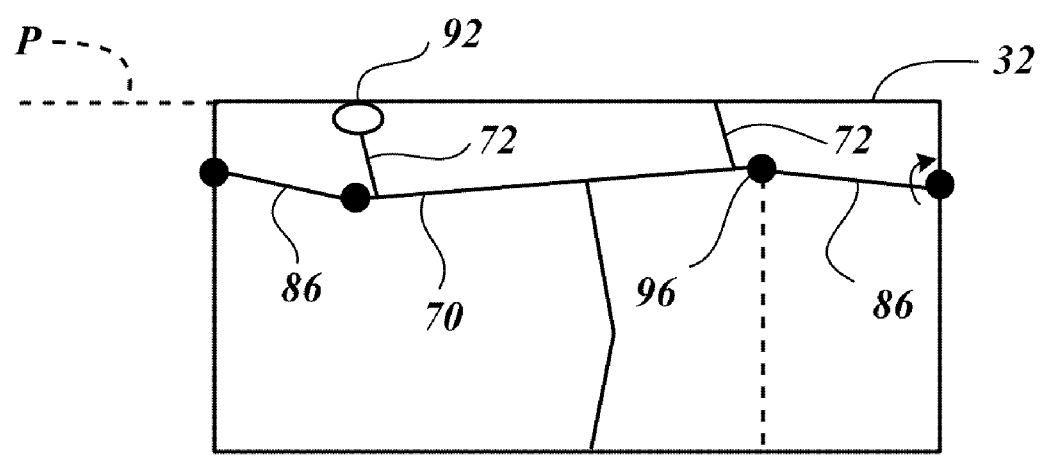
FIG. 9 is a schematic view of the pin cell shown in FIG. 7.

Referring to both FIGS. 8 and 9, an important consideration in preventing out-of-plane distortion of substrate 32 upon flexing of pin 61 in the presence of particulate contaminant 92 is to ensure that potential remote axis is properly positioned. In the present example, the potential remote axis, e.g., one of axes 93, 94, 95, 96, 97, 98, 99, 100, 101, 102, 103, 104, 105, 106 and 107 does not lie between contact lands 72. Rather it is desired that each of the potential remote axis, e.g., axes 93, 94, 95, 96, 97, 98, 99, 100, 101, 102, 103, 104, 105, 106 and 107 lie between contact land 72, without having particulate contaminant 92, and closest to side wall 86. With this configuration the presence of particulate contaminant 92 on one of contact lands 72 will cause pin 61 to move away from substrate 32 without the remaining contact land 72, positioned between particulate contaminant 92 and the remote axis, from extending upwardly toward substrate 32, beyond plane P in the presence of particulate contaminant 92. More specifically, contact land 72 having particulate contaminant 92 thereon is subjected to a greater load than the remaining contact land 72. By providing rotation of pin 61 about an rotational axis spaced apart from land 72 having particulate contaminant 92 thereon as discussed above, out-of-plane distortion of substrate 32 due to compliance of pin cell 60 to the presence of particulate contaminant 92 is avoided.

Figure 10:
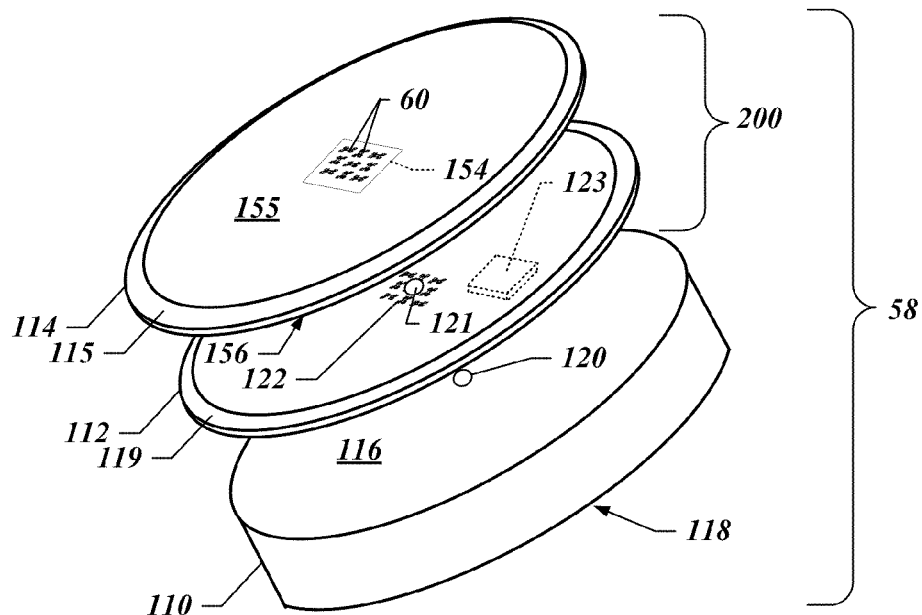
FIG. 10 is an exploded simplified perspective view of the chuck body shown in FIGS. 4 and 5.

Referring to FIGS. 1 and 10, body 58 of chuck system 57 may be fabricated from virtually any material, including aluminum, stainless steel, silicon, silicon carbide and the like, or a combination of these materials. In the present example, body 58 is fabricated employing standard semiconductor processes. To that end, body 58 is formed from three distinct layers, shown as foundation layer 110, base layer 112 and pin layer 114. Foundation layer 110 merely comprises a body formed from silicon. Foundation layer 110 has opposing surfaces 116 and 118, one of which, for example surface 116, is substantially smooth, if not planar. A throughway 120 is centrally disposed in foundation layer 110 and extends between opposing surfaces 116 and 118. Throughway 120 may have any suitable diameter. In the present example a diameter of throughway 120 is approximate 3 millimeters. Exemplary dimensions foundation layer 110 are 100 millimeters.

Base layer 112 includes a centrally disposed through hole 121 adapted to be in superimposition with throughway 120 when base layer 112 and foundation layer 110 are placed in a final seating position. In the present example the diameter of through hole 121 is approximately 2 millimeters. Typically, the entire surface of base layer 112 that faces pin layer 114 is covered with base cells 122, excepting the region in which through hole 121 is present and region 119 which is located at a periphery of base layer 112 in superimposition with rim 115 of pin layer 114. However, eight base cells 122 are shown for simplicity. The detailed arrangement of an array of nine base cells 122 is discussed with respect to region 123, shown more clearly in FIG. 11, as well as FIG. 12.

Figure 11:
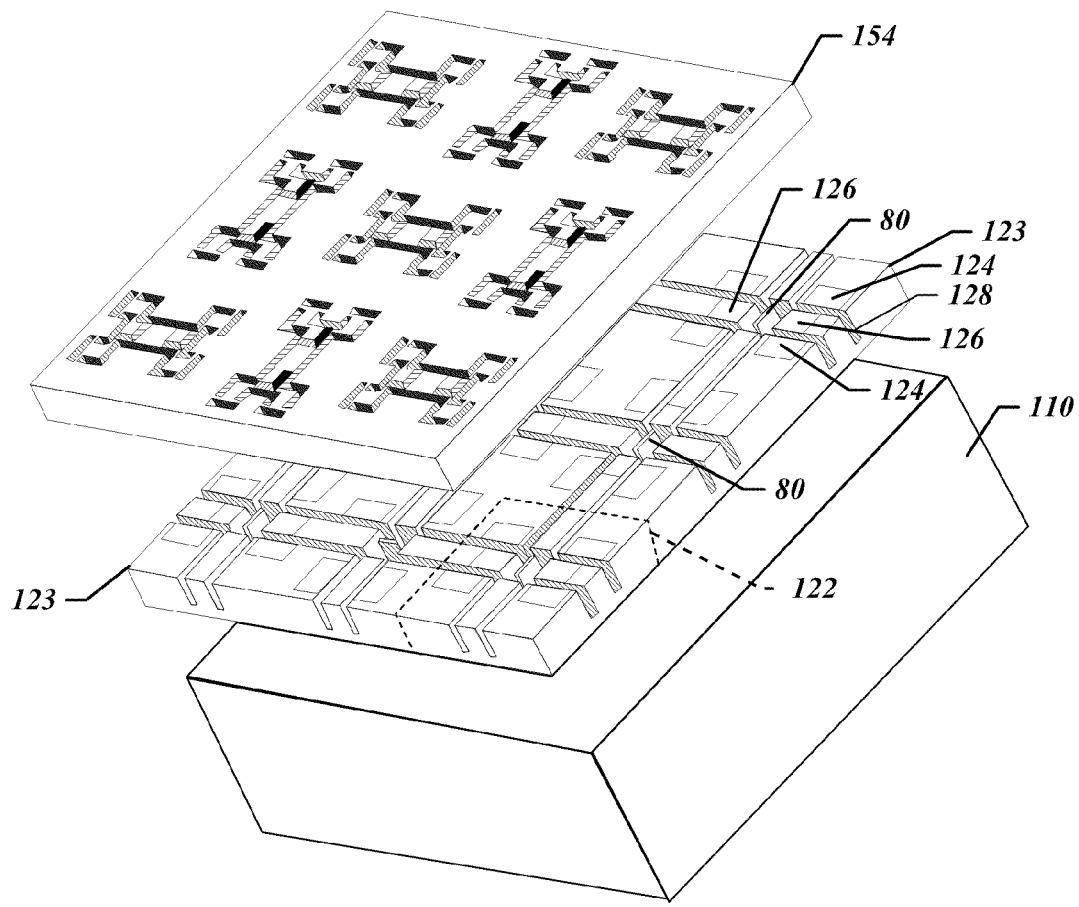
FIG. 11 is a detailed perspective view of a region of the chuck body shown in FIG. 10.
Figure 12:
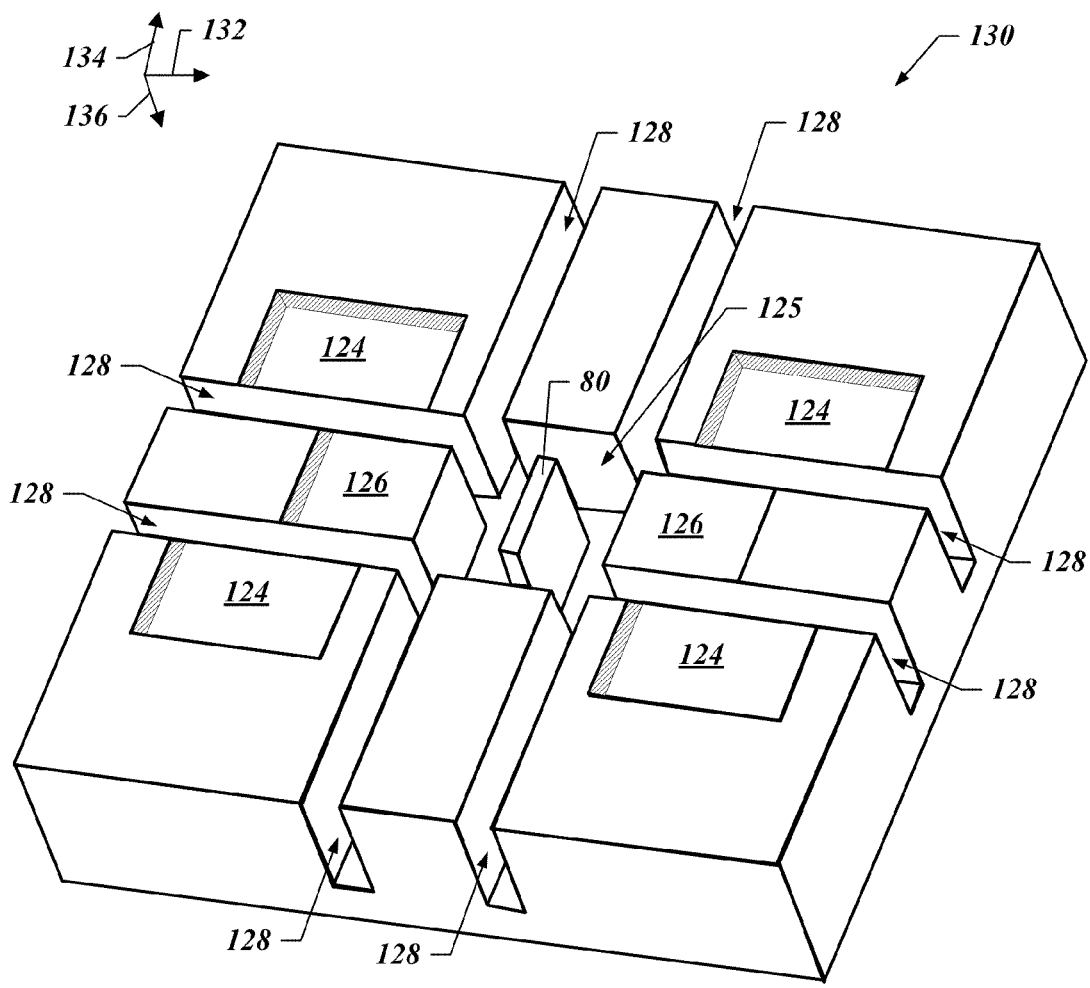
FIG. 12 is a detail perspective view of a region of the base layer shown in FIG. 11.
Figure 13:
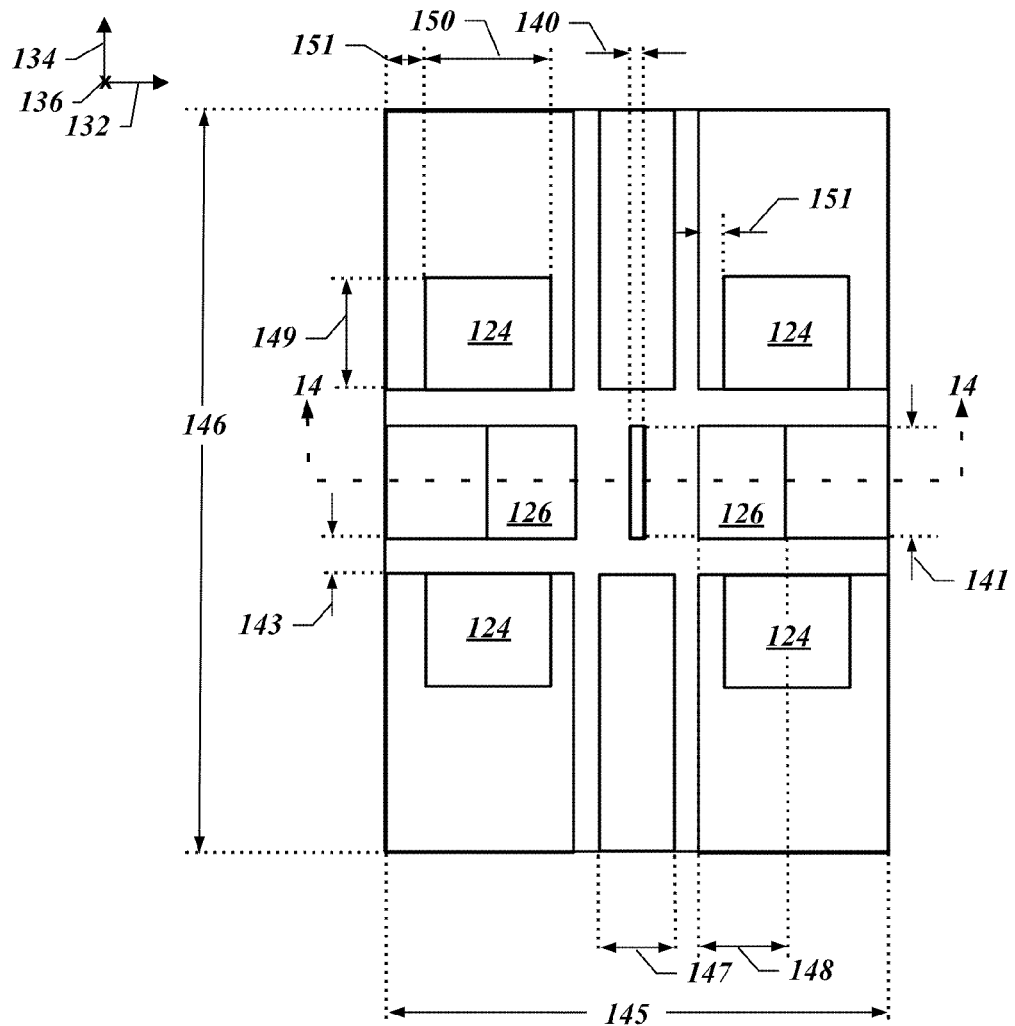
FIG. 13 is a top-down view of the region shown in FIG. 12.
Figure 14:
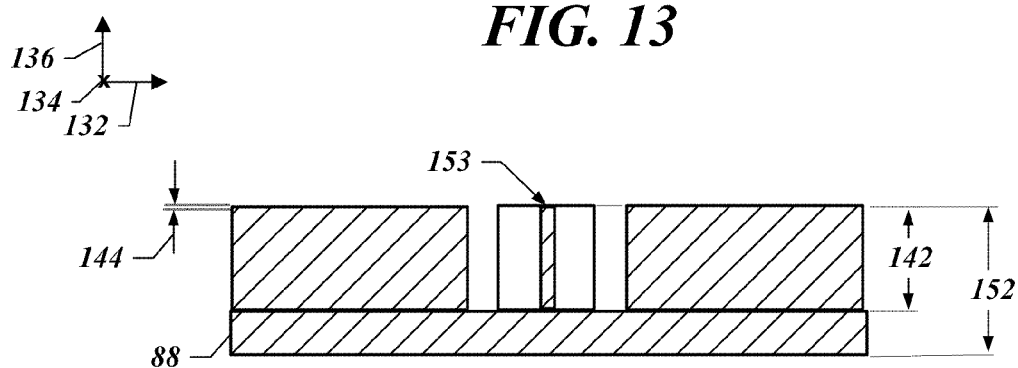
FIG. 14 is a cross-sectional view of the region shown in FIG. 13, taken along lines 14-14.

Referring to both FIGS. 11 and 12, each base cell 122 includes flexure stem 80, motion relief regions, shown as voids 125, in which flexure stems 80 are disposed, and recessed regions 124 and 126, as well as vacuum channels 128 extending in pairs from each of voids 125, with adjacent pairs of vacuum channels 128 extending orthogonally to one another.

Stem 80 is fabricated to facilitate flexing along direction 132. To that end, disposed on opposed sides of flexure stem 80 are recessed regions 126, with each of recessed regions being flanked by a pair of vacuum channels 128, extending along direction 132. Specifically, regions 126 are disposed on opposing sides of flexure stem 80 with each region 126 extending from void 125 away from flexure stem 80. Recess regions 124 are arranged in two pairs, with each of the two pairs of regions 124 being disposed on opposing side of flexure stem 80. Each of recessed regions 124 associated with each pair extends from one of the vacuum channels 128, extending adjacent to one of recessed regions 126, away from the remaining recessed regions 124 associated with the pair.

In an exemplary embodiment, a width 140 of flexure stem 80 measured along direction 132 is approximately 0.05 millimeter. A length 141 of flexure stem 80, measured along direction 134 is approximately 0.3 millimeter, with flexure stem 80 extending from foundation support 88, along direction 136 a distance 142 of approximately 0.35 millimeter. A width 143 of each vacuum channel, measured transversely to a height thereof that is determined along direction 136, is approximately 0.1 millimeter. Regions 124 and 126 are recessed a distance sufficient to allow pin 61 to flex in response to a particle contaminant no greater than the largest sized particulate contaminant anticipated and to ensure that the structural integrity of pin 61 is not compromised when subjected to forces produced by the presence of a larger particulate contaminant. In the present example, regions 124 and 126 are recessed a distance of approximately 0.01 millimeter with respect to an apex 153 of flexure stem 80, along direction 136. A width 145 of pin cell 60 measured along direction 132 is approximately two millimeters, and a length 146 of pin cell 60 measured along direction 134 is approximately two millimeters. A distance 147 between adjacent vacuum channels 128 of a given pair extending parallel to one another is approximately 0.3 millimeter. A width 148 of regions 126 extending from void 125 along direction 132 is approximately 0.35 millimeter, with regions 126 extending to be coextensive with length 141 of flexure stem 80. A length 149 of regions 124 extending from an adjacent vacuum channel 128, along direction 134, is approximately 0.3 millimeter, with a width 150 measured along direction 132 being approximately 0.5 millimeter. Each of regions 124 are spaced apart from an adjacent vacuum channel 128 extending along direction 134 a distance 151 of approximately 0.1 millimeter. Thickness 152 of base layer 112 is approximately 0.5 millimeter.

Referring to FIG. 10, pin layer 114 is coextensive with base layer 112. Typically, the entire surface of pin layer 114 is covered with pin cells 60, excepting a periphery region thereof in which a raised portion defining a land 115 is positioned surrounding pin cells 60. However, nine pin cells 60 are shown for simplicity. Pin layer 114 is adapted to be integrally bonded to base layer 112. For example, region 119 of base layer 112 is coextensive with land 115. Region 119 is typically bonded to a region of bottom surface 156 in superimposition with land 115 employing silicon fusion techniques. The detailed arrangement of an array of nine pin cells 60 is discussed with respect to region 154, shown more clearly in FIG. 11, as well as FIG. 15.

Figure 15:
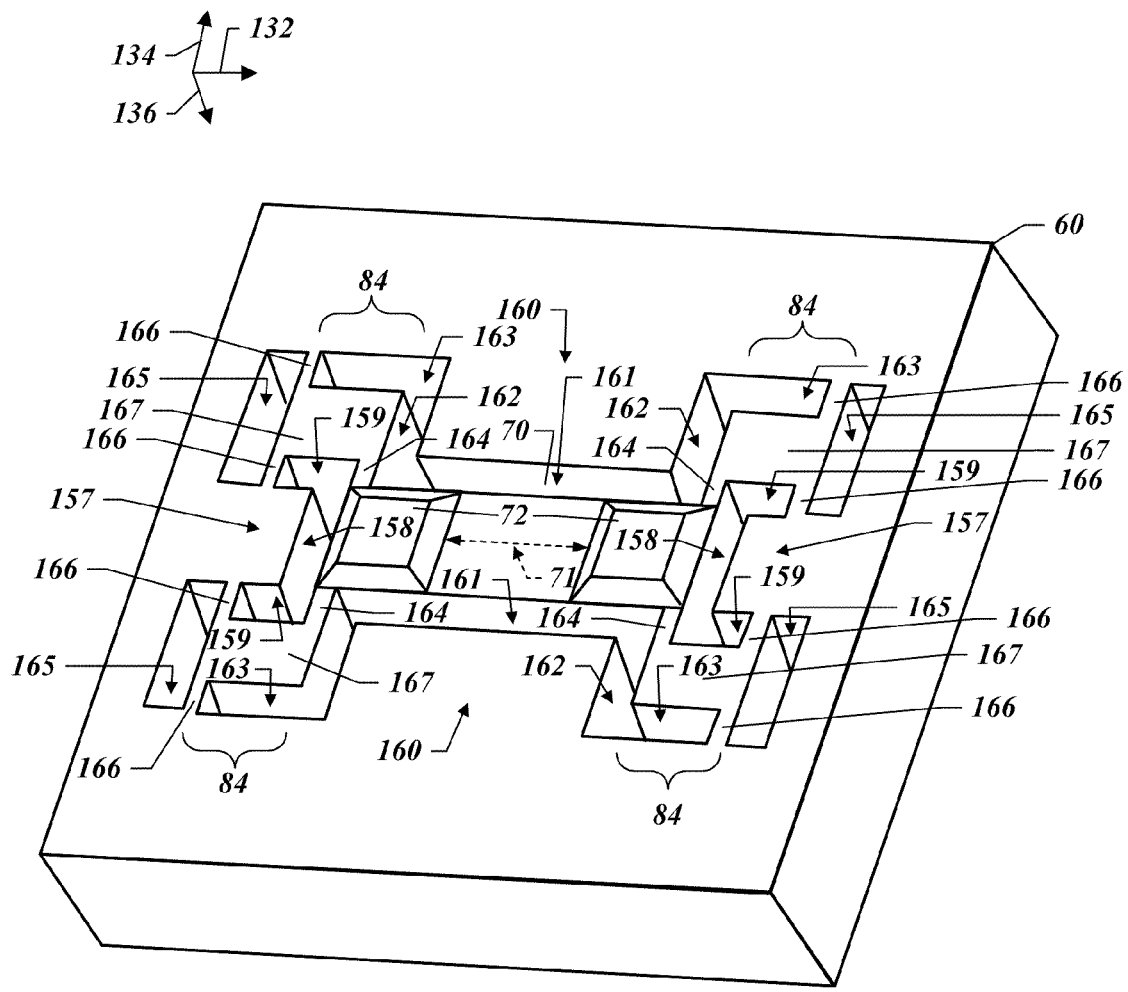
FIG. 15 is a detail perspective view of a region of the pin layer shown in FIG. 11.

Referring to both FIGS. 11 and 15, each of pin cells 60 includes cross-member 70, having a longitudinal axis 71 extending along direction 132, with contact lands 72 disposed on opposing ends thereof. In addition, each pin cell 60 includes side wall flexures 84 disposed proximate to one of contact lands 72. Cross-member 70, contact lands 72 and flexures 84 are integrally formed with a portion of pin layer 114 in which pin cell 60 is present by forming a plurality of throughways extending between opposed surfaces 155 and 156. Specifically, formed at each of contact lands 72 is a first pair of u-shaped throughways 157, having a base portion 158 disposed proximate to contact land 72 and extending along direction 134 a greater extent than contact land 72, terminating in a serif portion 159 located at each end of base portion 158. Serif portions 159 extend from base portion 158 away from contact lands 72.

A second pair of U-shaped throughways 160 includes a base portion 161 positioned proximate to cross-member 70 and extending between both contact lands 72. Specifically, base portion 161 extends along direction 132, transversely to direction 134, with each end thereof having a first serif portion 162 extending therefrom, away from cross-member 70 parallel to direction 134 and terminating in a second serif portion 163, defining a pair of second serif portions. Each of second serif portions 163 extends spaced-apart from and parallel to serif 159. In this manner, defined between each U-shaped throughway 157 and U-shaped throughway 160 is flexure member 84 configured with an L-shaped body. One end of flexure member 84 is connected to a corner of cross-member 70 proximate to a contact land 72, defining a primary joint 164. The remaining portion of flexure member 84 extends from primary flexure 164, terminating in a second end. Disposed proximate to, and spaced-apart from the second end of each flexure member 84 is a rectangular throughway 165, defining pair of spaced-apart secondary joints 166 proximate to the second end. The portion of flexure member 84 extending between primary joint 164 and secondary joints 166 defines a rigid body 167.

Figure 16:
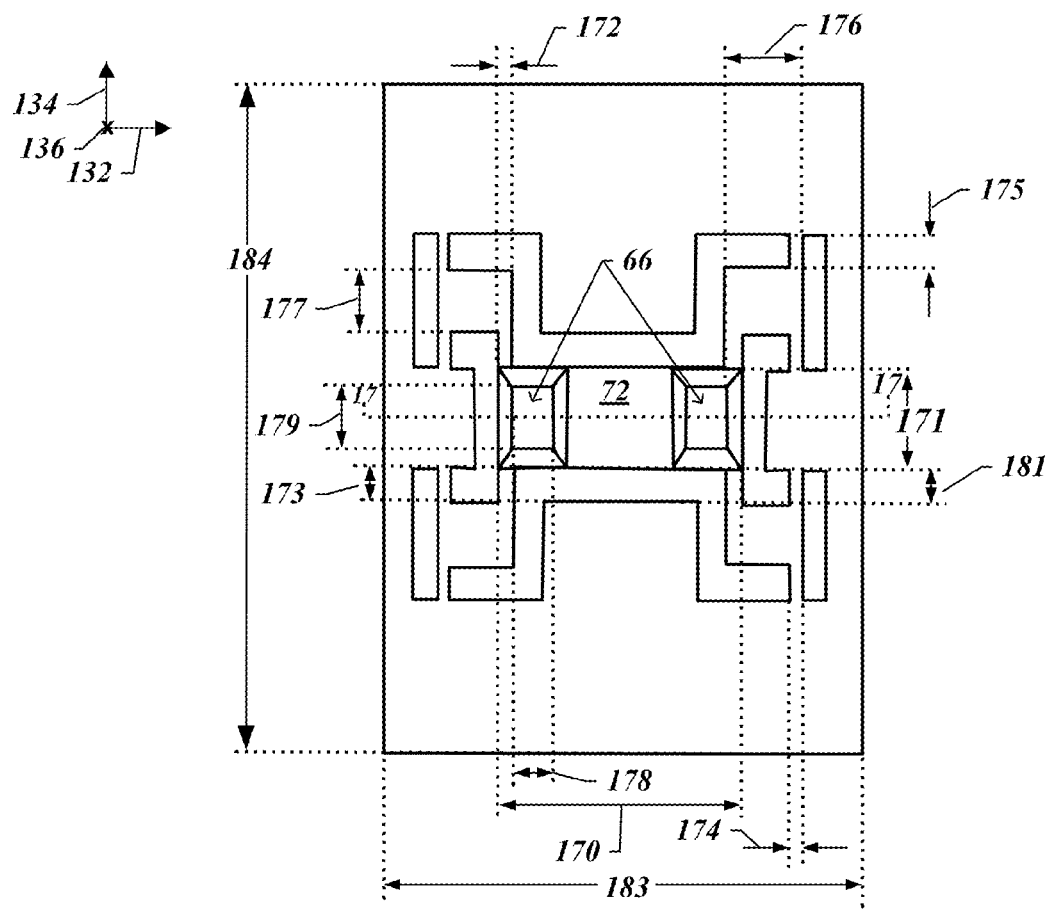
FIG. 16 is a top-down view of the region shown in FIG. 15.
Figure 17:
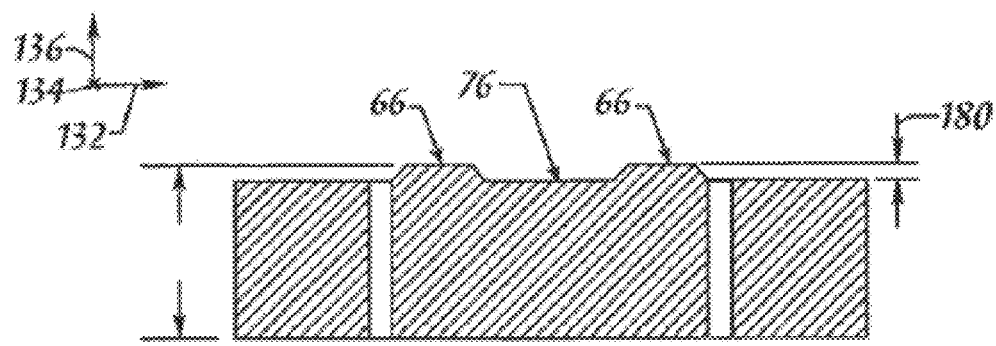
FIG. 17 is a cross-sectional view of the region shown in FIG. 16, taken along lines 17-17.

Referring to FIGS. 15, 16 and 17, in an exemplary embodiment, a length 170 of cross-member 70, measured along direction 132, is approximately 1 millimeter, and a width 171 of the same, along direction 134, is approximately 0.3 millimeter. A width 172 of primary joint 164, measured along direction 132, is approximately 0.05 millimeter and a length 173 of the same, measured along direction 134, is approximately 0.1 millimeter. A width 174 of secondary joints 166, measured along direction 132, is approximately 0.05 millimeter, and a length 175 of the same, measured along direction 134, is approximately 0.1 millimeter. A width 176 of rigid body 167, measured along direction 132, is approximately 0.3 millimeter, and a length 177 of the same, measured along direction 134, is approximately 0.2 millimeter. A width 178 and length 179 of contact surface 66 is approximately 0.2 millimeter, measured along directions 132 and 134, respectively. A height 180 of contact surface 66, from nadir surface 76 is approximately 0.05 millimeter, measured along direction 136. A length 181 of base portion 161, measured along direction 134, is approximately 0.1 millimeter. A width 183 and length 184 of pin cell 60 is approximately 2 millimeters, measured along directions 132 and 134, respectively.

Chuck body 58 may be fabricated using any known method. In the present example, chuck body 58 is fabricated from silicon wafers using standard micro-fabrication techniques. As a result, exemplary materials from which chuck body 58 may be fabricated include silicon and/or fused silica. Furthermore, to improve wear resistance, selective surfaces, e.g. contact lands 72, may be coated with hardened materials, such as silicon nitride, silicon carbide and the like. Typically, base layer 112 is fabricated separately from pin layer 114 and subsequently made integral employing standard techniques, such as, silicon welding, forming device layer 200. As a result, vacuum channels 128 and void 125 are in fluid communication with throughways 160, 157 and 166 and throughway 120. In an exemplary technique, assembly of device layer 200 with foundation layer 110 was undertaken with surface 155 facing an optical flat and a vacuum/electrostatic force being applied to chuck device layer 200. In this fashion, non-planarity in device layer 200 may be attenuated, if not abrogated. An adhesive is then applied to either surface of base layer 112 facing foundation layer 110 or surface 116 or both. Device layer 200 is then adhered to foundation layer 110. It is desired to provide a sufficient volume of adhesive so that non-planarity induced in device layer 200 due to non-planarity in surface 116 is attenuated.

To provide desired lateral stiffness to substrate 32, adjacent pin cells 60 of chuck body 58 are arranged so that longitudinal axes 71 of cross members 70 of adjacent pin cells 60 extend along orthogonal directions, i.e., neighboring pin cells 60 are oriented at 90 degrees with respect to each other.

The embodiments of the present invention described above are exemplary. Many changes and modifications may be made to the disclosure recited above while remaining within the scope of the invention. For example, foundation layer 110 may be abrogated and device layer may be employed with standard electrostatic and/or vacuum chucking devices. In this fashion, existing chucking systems may be retrofitted with device layer 200 substantially improving the operational characteristics of existing chucking systems. The scope of the invention should, therefore, be determined not with reference to the above description, but instead should be determined with reference to the appended claims along with their full scope of equivalents.

FIG. 18 illustrates another embodiment of pin cell 460 having multiple contact lands 472. Pin cell 460 may be designed to minimize contact area with substrate 32 (shown in FIG. 1). Pin cell 460 may have a cross-section 461 (e.g., T-shaped cross section) that includes a cross-member 470 having multiple contact lands 472 extending therefrom and terminating in contact surface 466, defining a recess 474 therebetween.

Recesses 474 may include a nadir surface 476. A base portion 478 of cross-member 470, disposed opposite to nadir surface 476, may be supported by a flexure stem 480. Side 482 may extend from base portion 478, terminating in contact surfaces 466. Alternatively, contact surfaces may be set a distance D from an edge 471 of cross-member as illustrated in FIG. 20A.

Figure 21:
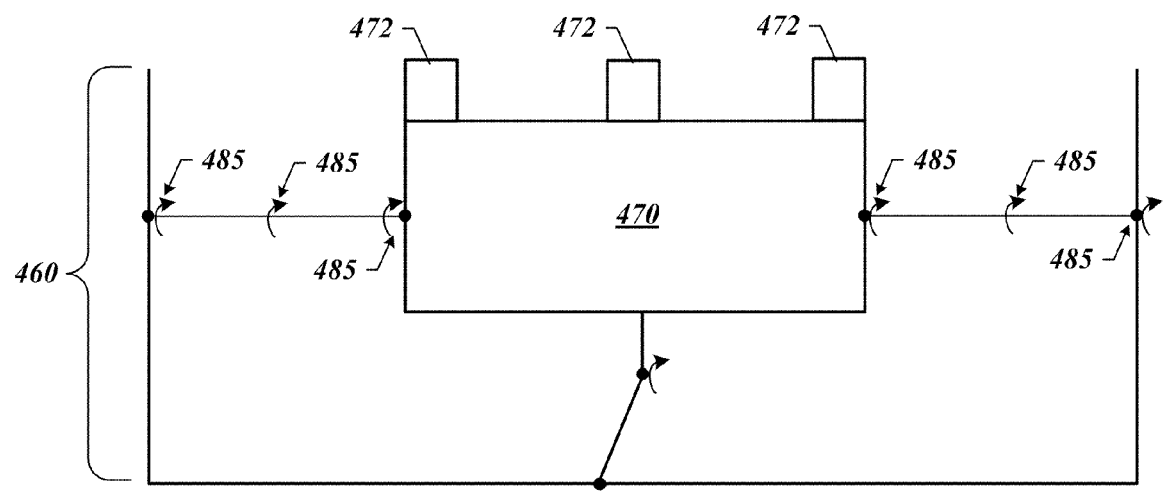

Referring to FIGS. 19-20, in alternate embodiments, pin cell 460 may include one or more side flexures 484. Side flexure 484 may extend from side surface 482, away from recess 474. Specifically, each of side flexures 484 may extend between a side wall 486 and side surfaces 482. Side flexure 484 may include one or more joints 485 providing movement as illustrated in FIG. 21.

Side wall 486 may extend from a support region 488, terminating in a surface 490. Surface 490 may be spaced-apart from may lie in a common plane with nadir surface 476. Foundation region 488 may extend between opposed side walls 486. Flexure stem 480 may extend between foundation region 488 and base portion 478.

Pin cells 460 may be configured such that at least two contact lands lie in a substantially similar axis. For example, in FIG. 20A, at least two contact lands 472a and 472b lie in axis AB, at least two contact lands 472b and 472c lie in axis BC, and at least two contact lands 472c and 472a lie in axis CA.

Contact lands 472 may be configured such that contact lands 472 are equally loaded with force to which the same is subjected by substrate 32 (shown in FIG. 1). In this manner, the load to which pin cell 460 may be subjected is transferred to ground, i.e., foundation region 488. As a result, each of pin cells 460 may operate much like an ordinary pin-type chuck when supporting a "uniform normal load". However, unlike typical pin-type chucking mechanisms, in the presence of a non-uniform load, e.g., in the presence of a particulate contaminant disposed between substrate 32 (shown in FIG. 1) and one or more of contact lands 472, pin 460 may become compliant providing rotation about one or more axes AB, BC or CA. or an axis parallel thereto (e.g., a parallel axis between contact lands 472 and side wall 482). For example, rotation may be in an axis parallel to axis AB. Parallel axes may be disposed between axes AB, BC or CA and side wall 486. For example, a particulate containment located at contact land 472b, pin may become compliant and rotate about axis AC or an axis parallel to axis AC between axis AC and side wall 486. Specifically, flexure stem 480 and/or side flexures 484 may flex, allowing pin 461 to be compliant. This may minimize, if not abrogates, non-planarity in substrate 32 (shown in FIG. 1) due to the presence of particulate contaminant similar to embodiments herein.

Pin cells 460 may further be compliant to one dimensional defects such as scratches. To that end, height of each of contact lands 472, measured between nadir surface 76 and contact surface 66, may have a magnitude no less than the maximum dimension of anticipated particulate contaminants. As a result, in the presence of particulate contaminant 92, being disposed between nadir surface 474 and substrate 32 (shown in FIG. 1), particulate contaminate 92 may not affect planarity of substrate 32.

What is claimed is:

1. A substrate support system comprising:
a chuck body having a body surface with a pin extending therefrom having a contact surface lying in a plane, the pin being movably coupled to the chuck body to move with respect to the plane, the pin includes a cross-member having multiple contact lands extending from the cross-member, the pin is formed by a pin cell that further comprises a flexure system coupled between the cross-member and the chuck body.

2. The system as recited in claim 1 wherein the cross-member comprises a plurality of spaced-apart contact lands.

3. The system as recited in claim 1 wherein the pin is coupled to the chuck body to move away from the plane in response to loads being un-evenly distributed on the pin.

4. The system as recited in claim 3, wherein as a result of the pin moving away from the plane in response to an irregularity on a surface of the substrate, the surface of the substrate remains common to a plane common to a plurality of pairs of spaced-apart contact lands provided by a plurality of pin-cells.

5. The system as recited in claim 1 wherein the pin is coupled to the chuck body to rotate about a remote center of compliance spaced-apart from a region of the pin having a load thereon that is greater than a load to which the remaining regions of the pin are subjected.

6. The system as recited in claim 1 wherein the pin is coupled to the chuck body to rotate about a remote center of compliance spaced-apart from a region of the pin having a load thereon that is greater than a load to which the remaining regions of the pin are subjected, while avoiding any of the regions of the pin, lying in the plane, from moving toward the plane.

7. The system as recited in claim 1 further including a plurality of pins, with the plurality of pins surround by a rim.

8. The system as recited in claim 1 further including a plurality of pins-cells, each of which further comprises a pin including a cross-member having a longitudinal axis, with the longitudinal axis of cross-members of adjacent pins oriented randomly.

9. The system as recited in claim 1 wherein the chuck body is operable for disposing a substrate using an electrostatic force or using a force provided by a vacuum.

10. The system as recited in claim 1 wherein the chuck body comprises a plurality of pin-cells and wherein the plurality of pin-cells are formed by fusing a base layer and a pin layer.

11. The system as recited in claim 1, wherein the cross-member includes three contact lands.

12. The system as recited in claim 1, wherein the cross-member includes greater than three contact lands.

13. A substrate support system comprising:
a pin having a contact surface lying in a plane, the pin being movably coupled to a chuck body to move with respect to the plane, the pin includes a cross-member having multiple contact lands extending from the cross-member, wherein the pin is formed by a pin cell that further comprises a flexure system coupled between the cross-member and the chuck body.

14. The substrate support system of claim 13, wherein the flexure system includes a flexure stem coupled between the cross-member and the chuck body.

15. The substrate support system of claim 14, wherein the flexure system includes at least one side flexure.

16. The substrate support system of claim 13, wherein the cross-member includes two contact lands.

17. The substrate support system of claim 13, wherein the cross-member includes three contact lands.

18. The substrate support system of claim 17, wherein each contact land is positioned at a substantially similar distance from an edge of the cross-member.

19. The substrate support system of claim 13, wherein the pin is coupled to the chuck body to rotate about a remote center of compliance spaced-apart from a region of the pin having a load thereon that is greater than a load to which the remaining regions of the pin are subjected, while avoiding any of the regions of the pin, lying in the plane, from moving toward the plane.

20. A substrate support system comprising:
a chuck body having a body surface; and,
at least one pin having a contact surface lying in a plane, the pin being movably coupled to the chuck body to move with respect to the plane, the pin includes a cross-member having multiple contact lands extending from the cross-member,
wherein the pin is formed by a pin cell that further comprises a flexure system coupled between the cross-member and the chuck body.

* * * * *